US008513121B2

(12) United States Patent
Ishino et al.

(10) Patent No.: US 8,513,121 B2
(45) Date of Patent: Aug. 20, 2013

(54) SEMICONDUCTOR MEMORY DEVICE AND MANUFACTURING METHOD THEREOF

(75) Inventors: Masakazu Ishino, Tokyo (JP); Hiroaki Ikeda, Tokyo (JP); Kayoko Shibata, Tokyo (JP)

(73) Assignee: Elpida Memory, Inc., Chuo-Ku, Tokyo (JP)

( * ) Notice: Subject to any disclaimer, the term of this patent is extended or adjusted under 35 U.S.C. 154(b) by 0 days.

(21) Appl. No.: 13/621,134

(22) Filed: Sep. 15, 2012

(65) Prior Publication Data

US 2013/0011967 A1  Jan. 10, 2013

Related U.S. Application Data

(60) Continuation of application No. 13/005,350, filed on Jan. 12, 2011, now Pat. No. 8,298,940, which is a division of application No. 12/537,723, filed on Aug. 7, 2009, now Pat. No. 7,893,540, which is a division of application No. 11/476,145, filed on Jun. 28, 2006, now Pat. No. 7,576,433.

(30) Foreign Application Priority Data

Jun. 30, 2005 (JP) ................................. 2005-191257

(51) Int. Cl.
*H01L 21/44* (2006.01)
*H01L 21/48* (2006.01)
(52) U.S. Cl.
USPC ...... 438/667; 438/108; 438/109; 257/E21.614
(58) Field of Classification Search
USPC .................. 438/667, 108, 109; 257/E21.614
See application file for complete search history.

(56) References Cited

U.S. PATENT DOCUMENTS

| 4,074,342 | A  | 2/1978 | Honn et al. |
| 6,087,719 | A  | 7/2000 | Tsunashima |
| 6,335,491 | B1 | 1/2002 | Alagaratnam et al. |

(Continued)

FOREIGN PATENT DOCUMENTS

| JP | 2001-024150 A | 1/2001 |
| JP | 2004-327474 A | 11/2004 |

(Continued)

OTHER PUBLICATIONS

Japanese Office Action, w/ partial English translation thereof, issued in Japanese Patent Application No. JP 2005-191257 dated Jan. 5, 2010.

*Primary Examiner* — Nitin Parekh
(74) *Attorney, Agent, or Firm* — McDermott Will & Emery LLP

(57) ABSTRACT

A semiconductor memory device has a plurality of core chips and an interface chip, whose specification can be easily changed, while suppressing the degradation of its reliability. The device has an interposer chip. First internal electrodes connected to core chips are formed on the first surface of the interposer chip. Second internal electrodes connected to an interface chip and third internal electrodes connected to external electrodes are formed on the second surface of the interposer chip. The interface chip can be mounted on the second surface of the interposer chip whenever desired. Therefore, the memory device can have any specification desirable to a customer, only if an appropriate interface chip is mounted on the interposer chip, as is demanded by the customer. Thus, the core chips do not need to be stocked in great quantities in the form of bare chips.

20 Claims, 14 Drawing Sheets

(56) References Cited

U.S. PATENT DOCUMENTS

| | | |
|---|---|---|
| 6,376,917 B1 | 4/2002 | Takeshita et al. |
| 6,577,013 B1 | 6/2003 | Glenn et al. |
| 6,611,052 B2 | 8/2003 | Poo et al. |
| 6,819,001 B2 | 11/2004 | Burdick, Jr. et al. |
| 7,098,070 B2 | 8/2006 | Chen et al. |
| 7,276,799 B2 | 10/2007 | Lee et al. |
| 7,388,293 B2 | 6/2008 | Fukase et al. |
| 7,691,673 B2 | 4/2010 | Sunohara et al. |
| 7,736,949 B2 * | 6/2010 | Chen et al. ............... 438/106 |
| 7,795,739 B2 | 9/2010 | Kurihara et al. |
| 2004/0061238 A1 | 4/2004 | Sekine |
| 2004/0080040 A1 | 4/2004 | Dotta et al. |
| 2004/0113261 A1 * | 6/2004 | Sunohara et al. ............. 257/700 |
| 2004/0173891 A1 | 9/2004 | Imai et al. |
| 2004/0180540 A1 | 9/2004 | Yamasaki et al. |
| 2004/0227258 A1 | 11/2004 | Nakatani |
| 2004/0232559 A1 | 11/2004 | Adelmann |
| 2005/0046002 A1 | 3/2005 | Lee et al. |
| 2005/0167812 A1 | 8/2005 | Yoshida et al. |
| 2005/0263869 A1 | 12/2005 | Tanaka et al. |
| 2006/0063312 A1 | 3/2006 | Kurita |
| 2006/0231927 A1 | 10/2006 | Ohno |
| 2006/0267188 A1 | 11/2006 | Ishino et al. |
| 2007/0013048 A1 | 1/2007 | Sunohara et al. |
| 2008/0272477 A1 * | 11/2008 | Do et al. .................. 257/686 |
| 2009/0075478 A1 | 3/2009 | Matsui |

FOREIGN PATENT DOCUMENTS

| | | |
|---|---|---|
| JP | 2004-349694 A | 12/2004 |
| JP | 2006-019433 A | 1/2006 |
| JP | 2006-319243 A | 11/2006 |

* cited by examiner

SEMICONDUCTOR MEMORY DEVICE AND MANUFACTURING METHOD THEREOF

CROSS-REFERENCE TO RELATED APPLICATION

The present application is continuation of U.S. patent application Ser. No. 13/005,350 filed Jan. 12, 2011, now U.S. Pat. No. 8,298,940 which is a divisional of U.S. patent application Ser. No. 12/537,723 filed on Aug. 7, 2009 now U.S. Pat. No. 7,893,540, which is a divisional of U.S. patent application Ser. No. 11/476,145 filed Jun. 28, 2006 now U.S. Pat. No. 7,576,433 which claims priority of Japanese Patent Application No. 2005-191257 filed on Jun. 30, 2005, the entire contents of each of which are hereby incorporated by reference.

TECHNICAL FIELD

The present invention relates to a semiconductor memory device and a manufacturing method thereof. More particularly, the invention relates to a semiconductor memory device in which a core unit having memory cells is integrated independently of an interface unit, and to a method of manufacturing a semiconductor memory device of this type.

BACKGROUND OF THE INVENTION

In recent years, the storage capacity of semiconductor memory devices, represented by a DRAM (Dynamic Random Access Memory), has increased. It is increasingly demanded that these devices can operate at higher speeds. The increase in storage capacity has been achieved by making memory cells smaller and by increasing the chip size. However, the miniaturization of memory cells is physically limited, and the increase in chip size leads to a reduction of yield and impairs an increase of operating speed.

To solve these problems fundamentally, there has been proposed a method such that a core unit having memory cells and an interface unit having peripheral circuits to the memory cells are provided as chips that are independent of each other, and a plurality of core chips can be allocated to one interface chip (see Japanese Patent Application Laid-open No. 2004-327474). This can greatly decrease the size of each chip. In view of this, the method is expected to increase the storage capacity of semiconductor memory devices even more, while preserving high yield of the semiconductor memory devices.

Assume that the core unit and the interface unit are separate chips. The core chip and the interface chip can be fabricated in a memory process and a logic process, respectively. Generally, transistors made in the logic process can operate at higher speed than the transistors made in the memory process. Hence, if the interface chip is manufactured in the logic process, it can operate faster than the conventional interface chips. As a result, the interface chip enables the semiconductor memory device incorporating it to operate at high speed. Furthermore, the operating voltage of the interface chip can be lowered by about 1V, which helps to reduce the power consumption in the semiconductor memory device.

FIG. 18 is a schematic sectional view showing the structure of a conventional semiconductor memory device.

As shown in FIG. 18, the conventional semiconductor memory device includes an interposer substrate 10, an interface chip 20, and a plurality of core chips 31 to 34 (four core chips, for example). The interface chip 20 is provided on one surface 10a of the interposer substrate 10. The core chips 31 to 34 are mounted on the interface chip 20 one on another. The device gives and receives signals to and from an external device through external terminals 11. The exchange of signals between the interface chip 20 and the core chips 31 to 34 is performed through internal terminals 40 provided on the interface chip 20 and the core chips 31 to 34, and through electrodes 41 penetrating the provided on the interface chip 20 and the core chips 31 to 34. In this semiconductor memory device, the signals received through the internal terminals have greater widths than the signals received through the external terminals 11. The interface chip 20 changes the widths of the signals.

More specifically, the signals (addresses, commands, write data or the like) output from an external circuit via the external terminals 11 are supplied to the interface chip 20, expanded by the interface chip 20 in terms of signal width, and supplied to the core chips 31 to 34. Conversely, the signals (read signals or the like) output from the core chips 31 to 34 are supplied to the interface chip 20, compressed by the interface chip 20 in terms of signal width, and output via the external terminals 11 provided on the interposer substrate 10. Thus, the device can greatly increase the band width of signals to supply and receive to and from logic circuits such as CPUs that operate at high speed, although unable to perform large-scale parallel processing in corporation with the memory cores such as DRAMs that operate at low speed.

Semiconductor memory devices, such as DRAMs, are available in various specifications, even though they are of the same type. They differ in the width of input and output data (e.g., the difference between x8 model and x16 model), in clock frequency (e.g., the difference between 200 MHz model and 266 MHz model). This difference in the specifications comes mainly from the circuit configuration of the interface chip 20. The conventional semiconductor memory devices cannot changed in specification once the layers have been laid one on another, because the interface chip 20 and the core chips 31 to 34 are mounted, at a time, on the interposer substrate 10. Inevitably, they cannot be flexibly manufactured on demand to meet the customers' needs.

To solve this problem, the interface chip 20 and the core chips 31 to 34 can be stocked in great quantities, not laid one on another, until the specification of the semiconductor memory device to manufacture is formulated. However, this method is disadvantageous in that bare chips, i.e., chips not encapsulated yet, possibly remain long exposed to external conditions. In particular, core chips probably become defective if exposed to the external conditions for a long time. If they are stocked in large quantities and not encapsulated, they may degrade the reliability of the semiconductor memory devices, i.e., final products incorporating them.

SUMMARY OF THE INVENTION

The present invention has been achieved to solve the problem described above. Therefore, an object of the present invention is to provide a semiconductor memory device has a plurality of core chips and an interface chip, whose degradation of its reliability.

The semiconductor device according to the present invention includes: an interposer chip that has a plurality of first internal electrodes formed on a first surface, a plurality of second internal electrodes formed on a second surface opposite to the first surface, a plurality of third internal electrodes formed on the second surface and arranged in a pitch, which is larger than a pitch of the second internal electrodes; and a plurality of core chips that are mounted on the first surface of the interposer chip and are connected to the first internal electrodes, wherein the interposer chip includes a semiconductor substrate, a re-wiring layer formed on at least one surface of the semiconductor substrate, a plurality of first through electrodes formed in the semiconductor substrate and connecting a part of the first internal electrodes to a part of the second internal electrodes, and a plurality of second through electrodes formed in the semiconductor substrate and connecting a remaining part of the first internal electrodes to a part of the third internal electrodes, and a pitch of the first through electrodes is substantially equal at least to the pitch of the first internal electrodes or to the pitch of the second internal electrodes.

In the present invention, the core chips are mounted on the second surface of the interposer chip whenever desired. Therefore, productions of various specifications can be easily provided. More specifically, appropriate interface chips that the customers have select are mounted on the semiconductor memory devices, thus easily providing semiconductor memory devices. The core chips do not need to be stocked in the form of bare chips, in great quantities. It is therefore possible to flexibly manufacture semiconductor memory devices on demand to meet the customers' needs, while suppressing the degradation of reliability of the products.

Since a pitch of the first through electrodes is substantially equal to a pitch of the first internal electrodes or a pitch of the second internal electrodes, or both, wires do not need to be guided so much on the re-wiring layer. The through electrodes are arranged at such a narrow pitch, because the main component of the interposer chip is a semiconductor substrate. The through electrodes cannot be arranged at such a narrow pitch if the main component of the interposer chip is an ordinary substrate such as a resin substrate or a ceramic substrate.

Before the interface chip is mounted on it, the semiconductor memory device according to the present invention cannot be connected to external electrodes. However, such an unfinished product is also called "semiconductor memory device" herein.

Preferably, the pitch of the first through electrodes is substantially equal to the pitch of the first internal electrodes and the pitch of the second internal electrodes. If so, the wires can be less guided on the re-wiring layer.

Meanwhile, a method of manufacturing a semiconductor memory device according to the present invention includes a step of mounting an interface chip on the second surface of the interposer chip incorporated in the semiconductor memory device of the type described above, so that the interface chip is connected to the second internal electrodes.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will be explained below with reference to the accompanying drawings.

Figure 1:
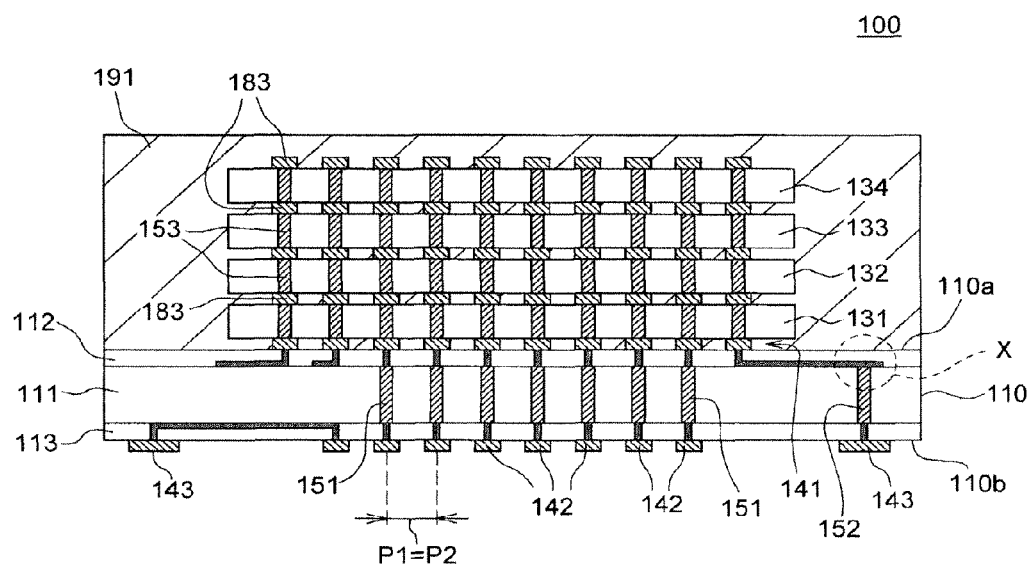
FIG. 1 is a sectional view of a semiconductor memory device 100 according to a first embodiment of the present invention.

FIG. 1 is a sectional view of a semiconductor memory device 100 according to a first embodiment of the present invention.

As shown in FIG. 1, the semiconductor memory device 100 according to the present invention has an interposer chip 110 and core chips (four core chips, in this example) 131 to 134. The core chips 131 to 134 are mounted one above another, on a core-mounting surface 110a (first surface) of the interposer chip 110. The core chips 131 to 134 mounted on the core-mounting surface 110a are molded with an encapsulating resin layer 191.

Figure 2:
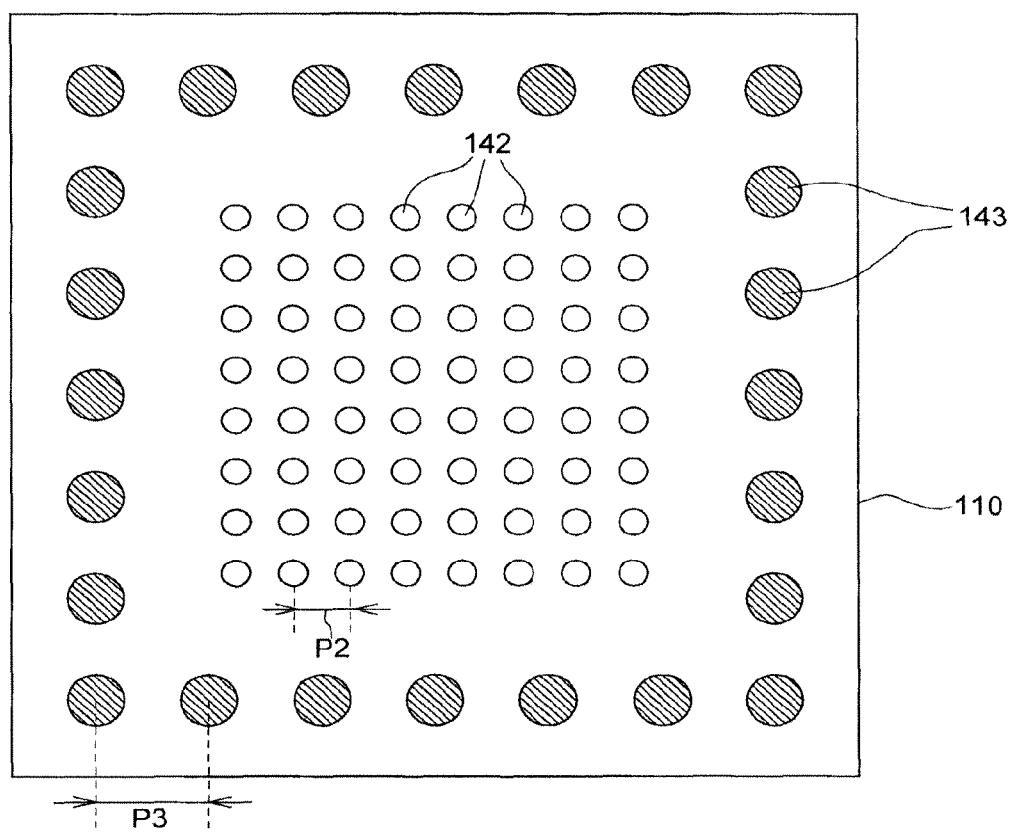
FIG. 2 is a schematic plan view of an interposer chip 110, as viewed from a mounting surface.

On the core-mounting surface 110a of the interposer chip 110 there are formed first internal electrodes 141. On a core-mounting surface 110b (second surface) of the interposer chip 110, there are formed second internal electrodes 142 and third internal electrodes 143. As shown in FIG. 2, which is a plan view of the interposer chip 110 as viewed from the mounting surface 110b, the second internal electrodes 142 are arranged on a central part of the interposer chip 110. The third internal electrodes 143 are arranged on a circumferential part of the interposer chip 110, surrounding the second internal electrode 142. A pitch P2 at which the second internal electrodes 142 are arranged is narrower than a pitch P1 at which the third internal electrodes 143 are arranged. In the present embodiment, the pitch P2 is nearly equal to the pitch P1 at which the first internal electrodes 141 are arranged.

The interposer chip 110 includes a semiconductor substrate 111 made of silicon (Si) and re-wiring layers 112 and 113 formed on the surfaces of the semiconductor substrate 111, respectively. First through electrodes 151 and second through electrodes 152 are provided in the semiconductor substrate 111. The first through electrodes 151 connect the first internal electrodes 141 to the second internal electrodes 142. The second through electrodes 152 connect the first internal electrodes 141 to the third internal electrodes 143. In the present embodiment, the re-wiring layer 112 connects the second through electrodes 152 to the first internal electrodes 141 that are not aligned with the second through electrodes 152 as viewed in a vertical direction. The re-wiring layer 113 connects the second through electrodes 152 to the third internal electrodes 143. Preferably, the first through electrode 151 and the second through electrodes 152 are made of electrical conductor. If they are made of metals, for example copper (Cu), their wiring resistance can be sufficiently low.

The first internal electrodes 141 are connected to internal terminals 183 of the core chip 131 that is a bare chip. Therefore, the pitch P1 of the first internal electrodes 141 is very narrow, for example about 50 μm. Similarly, the pitch P2 of the second internal electrodes 142 is narrow, about 50 μm, because the second internal electrodes 142 are connected to the internal terminals of an interface chip, that is a bare chip (described later).

In the present embodiment, the pitch of the first through electrodes 151 is almost equal to the pitch P1 of the first internal electrodes 141 and the pitch P2 of the second internal electrodes 142. The first through electrodes 151, the first internal electrodes 141 and the second internal electrodes 142 are therefore in effect aligned as viewed in the vertical direction. Hence, the wires of the re-wiring layer 112 do not need to be so arranged to connect the first through electrodes 151 to the first internal electrodes 141, and wires of the re-wiring layer 113 do not need to be so arranged to connect the first through electrodes 151 to the second internal electrodes 142.

As described above, the first through electrodes 151, the first internal electrodes 141 and the second internal electrodes 142 are in effect aligned as viewed in the vertical direction. Therefore, if the pitch P1 of the first internal electrodes 141 and the pitch P2 of the second internal electrodes 142 are both 50 μm, the pitch at which the first through electrodes 151 are arranged will also be about 50 μm. The first through electrodes 151 can be arrange at such a small pitch, because the main component of the interposer chip 110 is the semiconductor substrate 111. If an ordinary substrate made of resin or ceramic is used, the through electrodes 51 should not be arranged at such a small pitch in practice. In view of this, the use of the semiconductor substrate 111 as a main component of the interposer chip 110 is an important feature of the present invention. In this respect, this embodiment greatly differs from the ordinary modules whose substrate is made of resin, ceramic or the like.

In an example, in the ordinary substrates made of resin, ceramic or the like, it is difficult to arrange the through electrodes at a pitch of 0.2 mm or less. In the case of a 4×4 mm interface chip 120, the first through electrodes 151 cannot be provided in numbers excess of 400. If the semiconductor substrate 111 is used as in the present invention, the pitch of the through electrodes can be 0.05 mm or less. Hence, through electrodes can be formed in a density of 400 pieces/mm$^2$ or more.

An ordinary substrate made of resin, ceramic or the like can of course be used if re-wiring is performed to increase the pitch of the first through electrodes 151. However, the internal signals transferred between the core chips 131 to 134, on the one hand, and the interface chip 120, on the other, have very small amplitudes. Furthermore, the internal signals have but a very small driving ability. In view of these facts, it is important to arrange the through electrodes at such a very narrow pitch as in the present invention, not to transfer signals between the core chips 131 to 134 and the interface chip 120 by utilizing a wire of the re-wiring technique.

Figure 3:
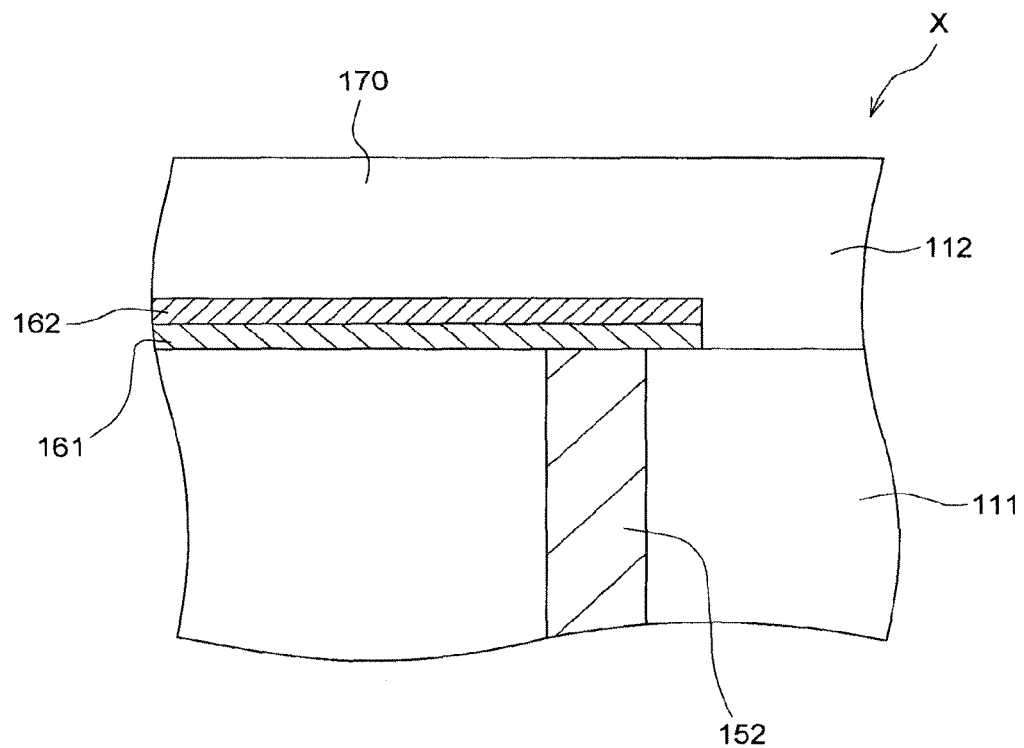
FIG. 3 is an enlarged sectional view of a section X of shown in FIG. 1.

FIG. 3 is an enlarged sectional view of a section X of shown in FIG. 1.

As shown in FIG. 3, each through electrode 152 (the same applies to the through electrode 151) provided in the semiconductor substrate 111 is connected at one end to the re-wire is composed of a sputtered titanium layer 161 and a sputtered copper layer 162 for example, one laid on the other. Another metals which are suitable for wiring, can be useful. The re-wire is covered with an insulating layer 170. The sputtered titanium layer 161 enhances the bonding between the semiconductor substrate 111 and the sputtered copper layer 162. It is desired that the semiconductor substrate 111 forming the interposer chip 110 be made thin by means of polishing, grinding or the like, although the method of making the substrate 111 thin is not limited. More specifically, it suffices to reduce the thickness of the substrate 111 to, for example, about 100 μm. The semiconductor memory device 100 can then be made thin as a whole, while preserving its sufficient mechanical strength.

The core chips 131 to 134 are chips, each having a number of DRAM memory cells. Each core chip has, in addition to the memory cells, a pre-charge circuit, circuits such as sense amplifiers and address decoders, and circuits to be used in the wafer test performed on the core chip. Unlike the ordinary DRAM, the core chip does not have some of the peripheral circuits, such as input and output circuits that are connected to external circuits. Hence, the core chips 131 to 134 cannot be used as an independent memory. Since the core chips 131 to 134 are not connected directly to external circuits, they have no units, such as buffers, which can output signals to external circuits. They have only input and output means that are only sufficient enough to receive and supply signals within the semiconductor memory device 100.

The core chips 131 to 134 have the third through electrodes 153 and the internal terminals 183, respectively. Two internal terminals 183 are connected to the ends of each third through electrodes 153, respectively. The core chips 131 to 134 are connected to the second internal electrodes 142 by the first through electors 151 and the third through electrodes 153. In the present embodiment, the pitch of the first through electrodes 151 is equal to the pitch of the third through electrodes 153. The first through electrodes 151, the third through electrodes 153, the first internal electrodes 141, and the second internal electrodes 142 are therefore aligned in effect as viewed in the vertical direction.

It is desired that the core chips 131 to 134 are made thin by means of polishing or the like, although the method thereof is not limited. More specifically, it suffices to reduce the thickness of the core chips to, for example, about 50 μm.

Figure 4:
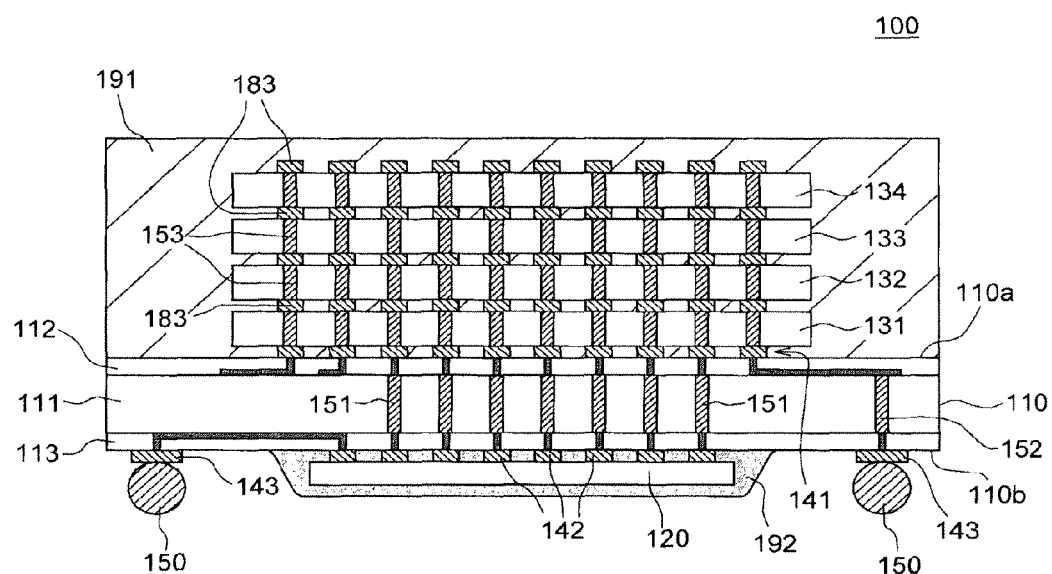
FIG. 4 is a schematic sectional view of the configuration of the semiconductor memory device 100, on which an interface chip 120 is mounted.

The semiconductor memory device 100 thus configured is a so-called unfinished product, and it cannot operate by itself. As shown in FIG. 4, the interface chip 120 is mounted on the mounting surface 110b of the interposer chip 110 and connected to the second internal electrodes 142, and the external terminals 150 are formed on the third internal electrodes 143. The interface chip 120 is molded with an encapsulating resin layer 192 by means of potting-molding and is thereby protected physically. The semiconductor memory device 100 in this state is mounted on a printed board (not shown) or a module board (not shown). The combination of the device 100 and the printed or module board is regarded as one large memory unit by external circuits.

The interface chip 120 has peripheral circuits to the core chips 131 to 134. These peripheral circuits include address buffers, refresh counters, and input and output circuits for external circuits. The interface chip 120 changes the width of the internal signals it has received via the internal electrodes 141, and changes the width of the external signals it has received via the external terminals 150.

When the interface chip 120 is mounted on the mounting surface 110b of the interposer chip 110, it receives the signals (addresses, commands, write data or the like) temporarily supplied through the external terminals 150. The interface chip 120 expands the width of these signals, and the expanded signals are supplied to the core chips 131 to 134. The signals (read data or the like) output from the core chips 131 to 134 are supplied to the interface chip 120. The interface chip 120 compresses the width of these signals. The signals thus compressed are output through the external terminals 150.

The first through electrodes 151 that connect the interface chip 120 to the core chips 131 to 134 are used to transfer internal signals. The second through electrodes 152 that connect the external terminals 150 to the core chips 131 to 134 are used to supply power. Power can be supplied to the core chips 131 to 134 directly from an external circuit because the core chips 131 to 134 have, as described above, no units (e.g., butters) that must output signals to external circuits, although between the core units 131 to 134 and any external circuit, signals must be transferred through the interface chip 120. Note that the external terminals 150 arc connected to the interface chip 120 by the re-wiring layer 113 to supply power and signals to the interface chip 120.

As explained above, the interface chip 120 is mounted on the semiconductor memory device 100 according to this embodiment after the core chips 131 to 134 are molded The device 100 can be therefore made into products of various specifications. A large number of the semiconductor memory devices 100 of FIG. 1, each incorporating the core chips 131 to 134, may be stocked, and interface chips 120 of desired types may be mounted on the devices 100 according to the customers' requests. Therefore, the core chips 131 to 134 in the form of bare chips do not need to be stocked in large quantities. This makes it possible to flexibly manufacture the product on the customers' demand, while preventing the product from being degraded in reliability.

A method of manufacturing the semiconductor memory device 100 according to this embodiment will be explained.

Figure 5:
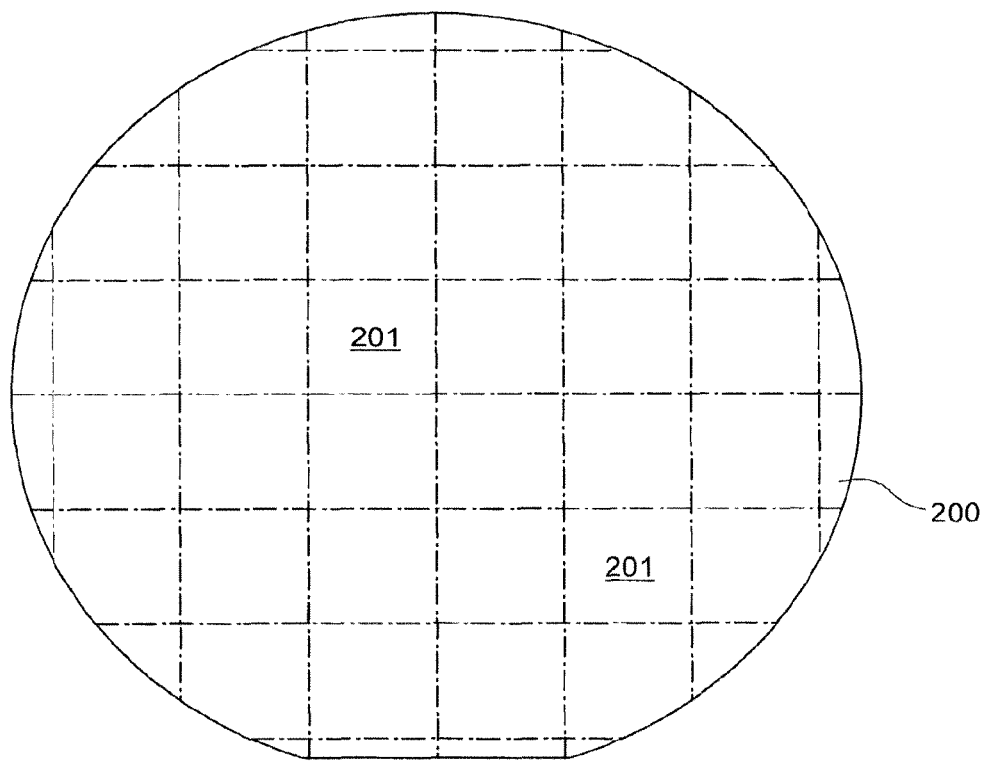
FIG. 5 is a schematic plan view of a semiconductor wafer 200 including a plurality of interposer regions 201.
Figure 6:
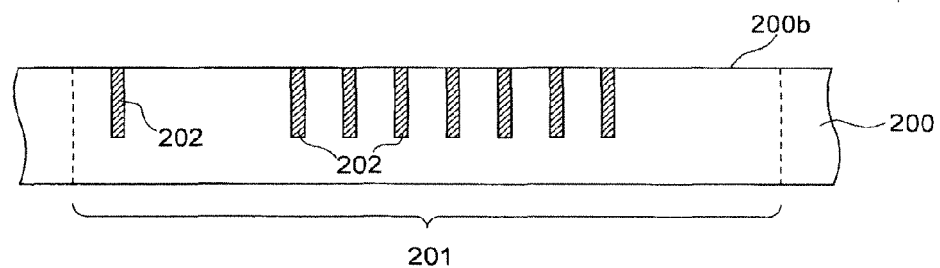
FIG. 6 is a partial sectional view showing a step of processing the semiconductor wafer 200 (a step of forming a conductive material 202)

First, a semiconductor wafer 200 is prepared as is shown in FIG. 5. The semiconductor wafer 200 includes a plurality of interposer regions 201. Each of the interposer regions 201 will be one interposer chip 110. As shown in FIG. 6, a plurality of trenches are formed in one surface 200b of each interposer region 201. A conductive material 202 is then applied and fills the trenches. The conductive material 202 is ultimately processed into the first through electrodes 151 and the second through electrodes 152.

Figure 7:
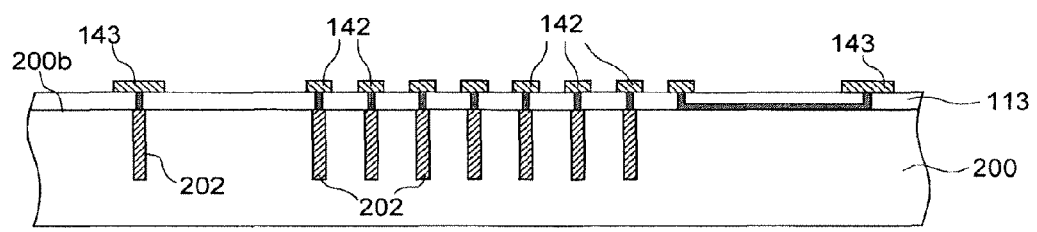
FIG. 7 is a partial sectional view showing a step of processing the semiconductor wafer 200 (a step of forming a re-wiring layer 113 and forming the second internal electrodes 142 and the third internal electrodes 143)

Next, shown in FIG. 7, the re-wiring layer 113 is formed on the surface 200b of the semiconductor wafer 200. Furthermore, the second internal electrodes 142 and the third internal electrodes 193 are formed on the re-wiring layer 113. The process on the surface 200b of the wafer 200 is thus completed.

Figure 8:
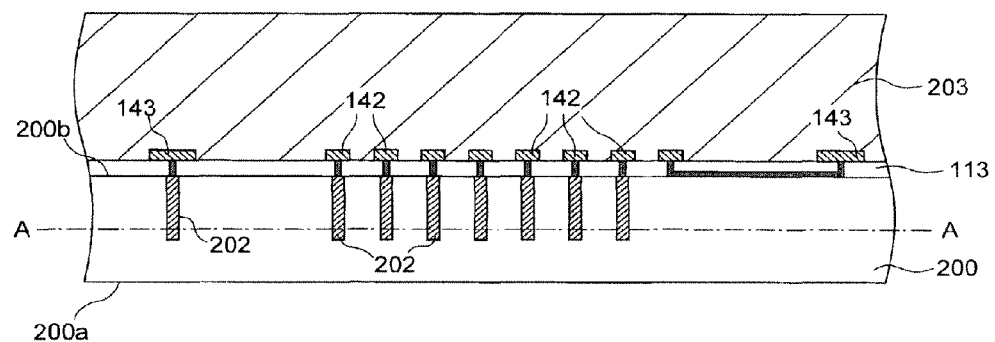
FIG. 8 is a partial sectional view showing a step of processing the semiconductor wafer 200 (a step of polishing the semiconductor wafer 200)
Figure 9:
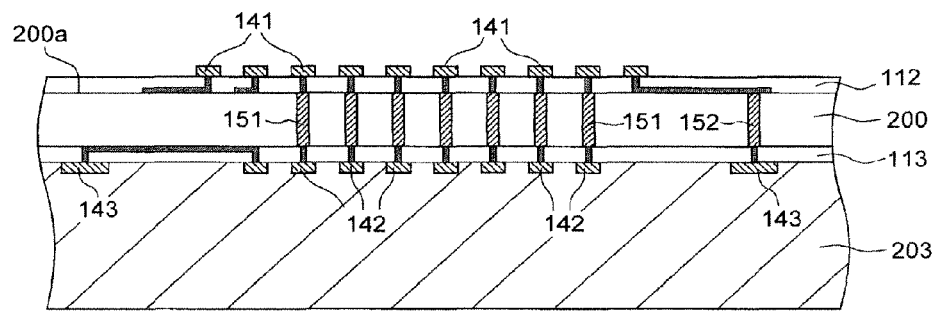
FIG. 9 is a partial sectional view showing a step of processing the semiconductor wafer 200 (a step of forming a wiring layer 112 and first internal electrodes 141)

Subsequently, a support substrate 203 made of, for example, glass is bonded to the surface 200b of the semiconductor wafer 200 via adhesion as is shown in FIG. 8. The semiconductor wafer 200 in this state is ground and polished at the other surface 200a, until the conductive material 202 filled in the trenches is exposed. In other words, the surface 200a is made thin to the plane indicated by a line A-A. The conductive material 202 filled in the trenches is thereby processed into the first through electrodes 151 and the second through electrodes 152. As shown in FIG. 9, the re-wiring layer 112 is formed on the surface 200a of the semiconductor wafer 200 polished and hence made thin. Furthermore, the internal electrodes 141 are formed on the re-wiring layer 112. In FIG. 9, semiconductor wafer 200 is mirror reversed caused by upside down.

The semiconductor wafer 200 having a plurality of the interposer chips 110 is thus provided.

Figure 10:
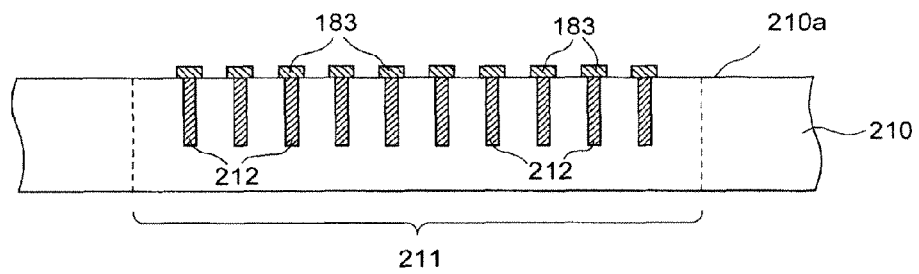
FIG. 10 is a partial sectional view showing a step of processing the semiconductor wafer 210 (a step of forming a conductive material 212 and internal terminals 183)

As shown in FIG. 10, another semiconductor wafer 210 is prepared, which has a plurality of DRAM-core regions 211 formed therein. Each of the DRAM-core regions 211 provided in this wafer 210 is processed into one core chip 131, 132, 133, or 134. As shown in FIG. 10, trenches are formed, in desired numbers, in one surface 210a of the semiconductor wafer 210. A conductive material 212 is applied and fills the trenches. The conductive material 212 is ultimately processed into the third through electrodes 153. The trenches may be filled with the conductive material, either before or after DRAM cores are formed by a diffusion process. The internal terminals 183 are then formed, covering the trenches filled with the conductive material 212.

Figure 11:
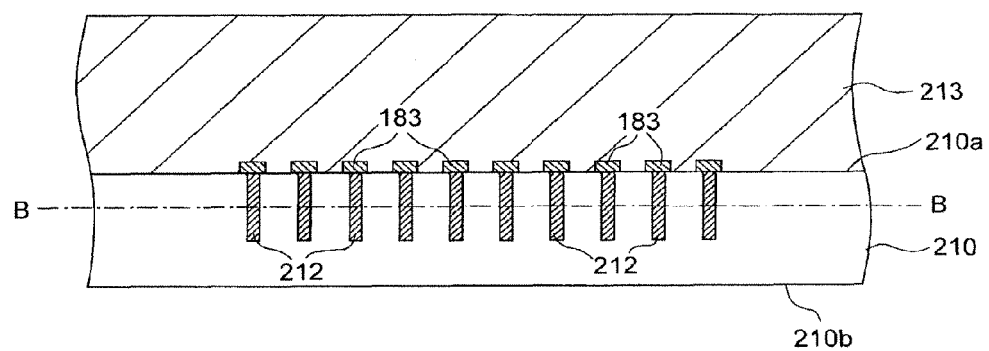
FIG. 11 is a partial sectional view showing a step of processing the semiconductor wafer 210 (a step of polishing the semiconductor wafer 210)
Figure 12:
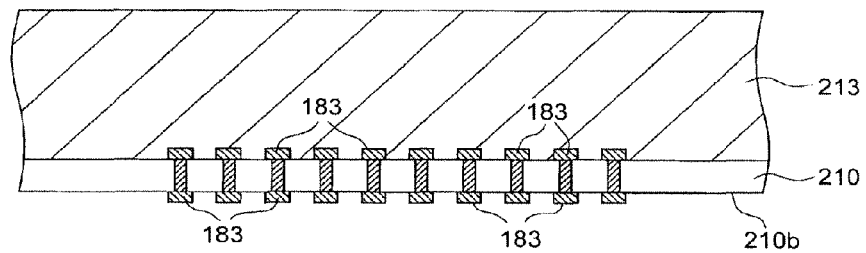
FIG. 12 is a partial sectional view showing a step of processing the semiconductor wafer 210 (a step of forming internal terminals 183)
Figure 13:
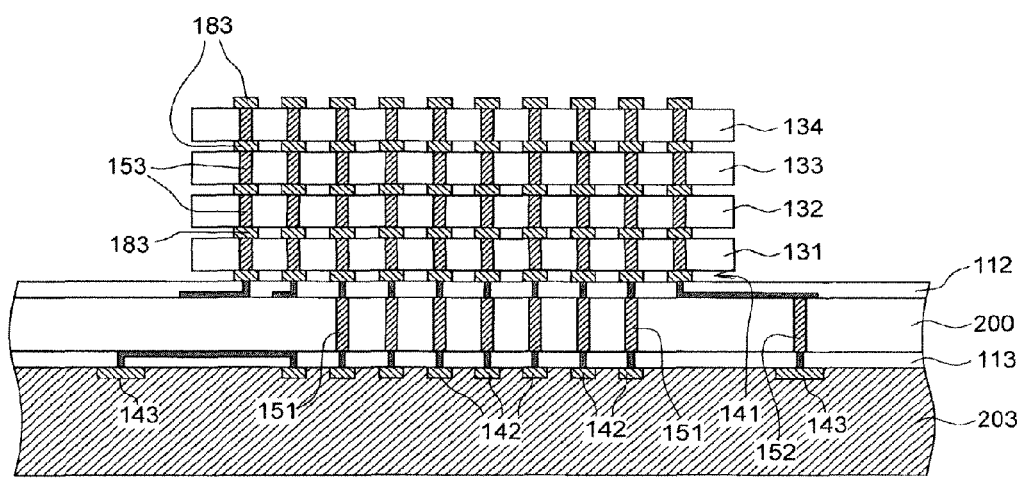
FIG. 13 is a partial sectional view showing laid core chips 131 to 134 one on another on the semiconductor wafer 200.

Next, as shown in FIG. 11, a support substrate 213 made of, for example, glass is bonded to the surface 210a of the semiconductor wafer 210. The semiconductor wafer 210 in this state is ground and polished at the other surface 210b, until the conductive material 212 filled in the trenches is exposed. In other words, the surface 210b is polished to the plane indicated by a line B-B. The conductive material 202 filled in the trenches is thereby processed into the third through electrodes 153 and the second through electrodes 152. As shown in FIG. 12, a plurality of the core chips 131 to 134 are provided when the internal terminals 183 are formed on those ends of the third through electrodes 153 which have been exposed, and the semiconductor wafer 210 is cut into the DRAM-core regions 211 by using a dicer.

The manufacture of the core chips 131 to 134 is thus completed.

After the semiconductor wafer 200 having a plurality of the interposer chips 110 and the core chips 131 to 134 have been thus provided, the internal terminals 183 of the core chip 131 are aligned with the internal electrodes 141 provided on the semiconductor wafer 200. The core chip 131 is then hot-pressed onto the semiconductor wafer 200. Furthermore, the core chips 132 to 134 are laid one on another, and hot-pressed onto the core chip 131, such that the internal terminals 183 of each core chip contact the corresponding internal terminals 183 of the adjacent core chip. Such a process of laying core chips on the first core chip is performed for each interposer region 201 of the semiconductor wafer 200.

Figure 14:
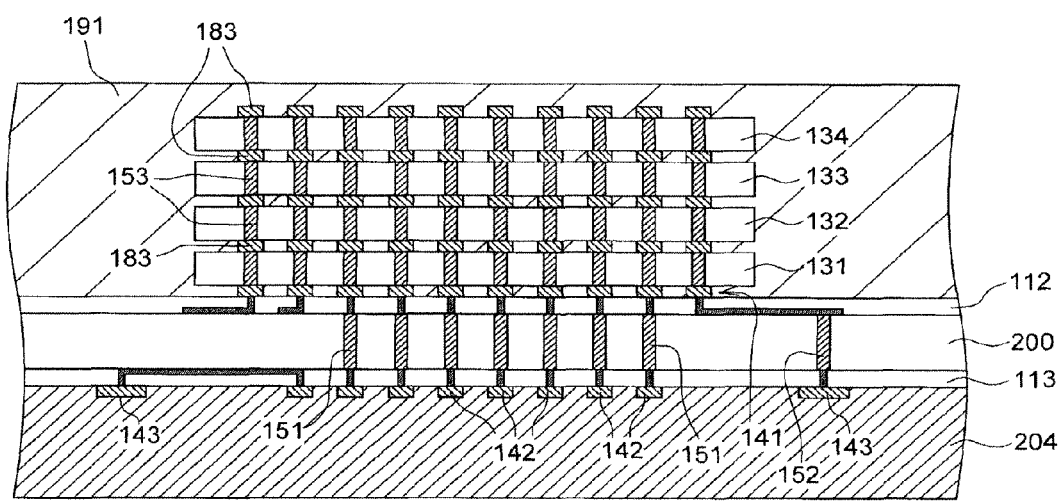
FIG. 14 is a partial sectional view showing the core chips 131 to 134 molded at a time with an encapsulating resin layer.
Figure 15:
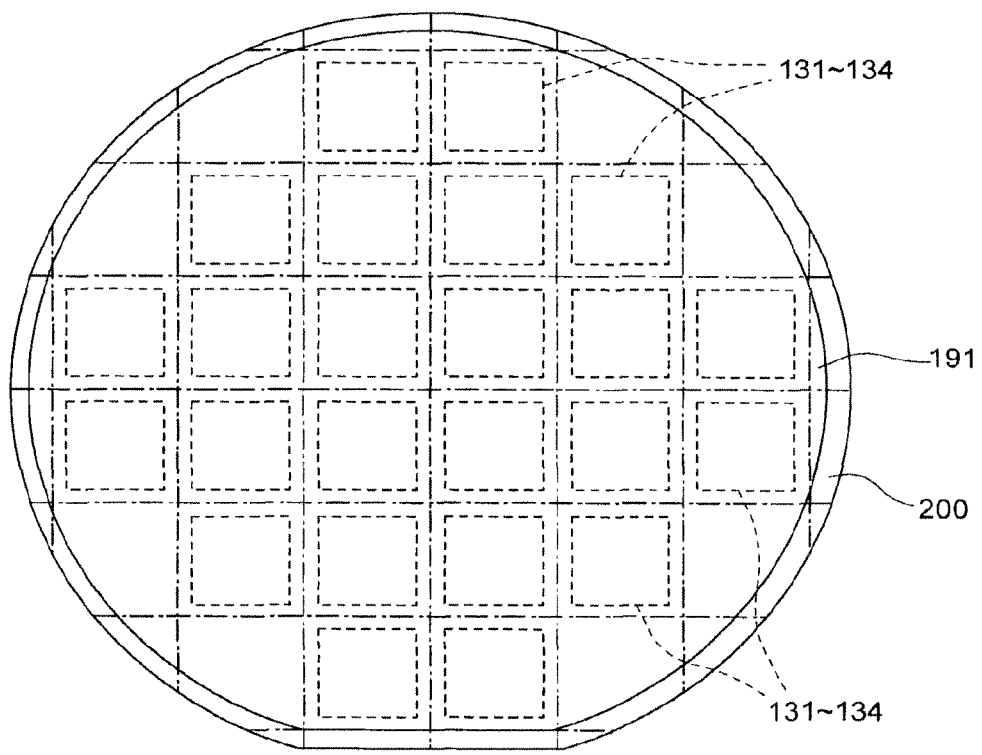
FIG. 15 is a plan view of the semiconductor wafer 200 molded with the encapsulating resin layer 191.

After the core chips 131 to 134 are laid one on another, the support substrate 203 is removed as shown in FIG. 14. A protective sheet 204 is then bonded to the surface 220b of the semiconductor wafer 200. The semiconductor wafer 200 is entirely molded with the encapsulating resin layer 191, whereby the core chips 131 to 134 are fixed to the semiconductor wafer 200 and physically protected. Although not shown, the gaps between the semiconductor wafer 200 and the core chips 131 to 134 may preferably be filled almost completely by means of under filling, before the semiconductor wafer 200 is molded with the resin layer 191. FIG. 15 is a plan view of the semiconductor wafer 200 molded with the encapsulating resin layer 191. Note that the protective sheet 204 prevents the second internal electrodes 142 from being contaminated while the semiconductor wafer 200 is being molded with the encapsulating resin layer 191. The support substrate 203 can be used in place of the protective sheet 204, if it can readily protect the semiconductor wafer 200.

The semiconductor wafer 200 is cut into the interposer regions 201, by using a dicer. A plurality of the semiconductor memory devices 100 of FIG. 1 can thereby produced.

Thereafter, the interface chip 120 selected by a customer is mounted, and the external terminals 150 is formed. The semiconductor memory device 100 of FIG. 4 is then obtained. In this case, the interface chip 120 may not be mounted immediately after the semiconductor memory device 100 is fabricated. Instead, several semiconductor memory devices 100 may be stocked, and the interface chip 120 and the external terminals 150 may be mounted and formed at the time the customer selects a specification for the final product. The devices 100 may be stocked in the form of the semiconductor wafers 200, that is, in the form of being uncut (see FIG. 15), or in the form of chips (see FIG. 1) provided by cutting the wafer 200. In either case, the devices 100 are stocked, each with the protective sheet 204 bonded to the surface 200b. The protective sheet 204 is peeled off immediately before the interface chip 120 is mounted and the external terminals 150 are formed. This can prevent the internal electrodes 142 or the like from being contaminated or corroded.

In the present embodiment, the core chips 131 to 134 are mounted on the semiconductor wafer 200 having a plurality of the interposer regions 201 and are molded at a time with the encapsulating resin layer 191. Therefore, many semiconductor memory devices 100, which are unfinished products, can be provided by cutting the semiconductor wafer 200. Appropriate interface chips 120 that the customers have select can be mounted on the semiconductor memory devices 100, thus easily providing semiconductor memory devices, i.e., finished products. Thus, semiconductor memory devices can be flexibly manufactured on demand to meet the customers' needs.

Figure 16:
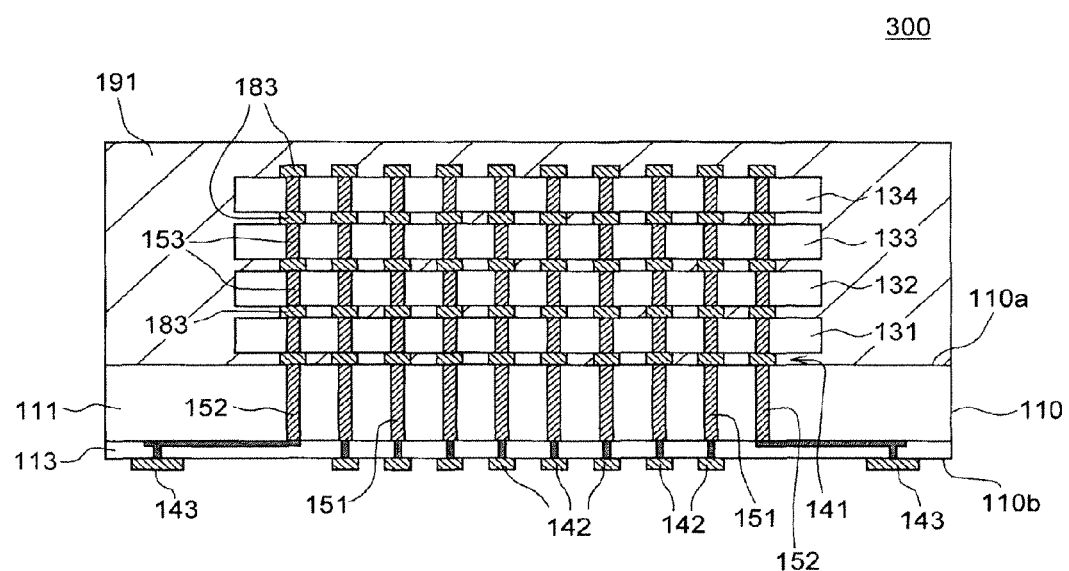
FIG. 16 is a sectional view of a semiconductor memory device 300 according to a second embodiment of the present invention.

FIG. 16 is a sectional view showing a semiconductor memory device 300 according to a second embodiment of the present invention.

The semiconductor memory device 300 according to this embodiment differs from the semiconductor memory device 100 described above, in two respects. First, the interpose chip 110 has no component equivalent to the re-wiring layer 112. Second, all re-wiring is provided on the re-wiring layer 113. Because of these different features, the first internal electrodes 141 and the third internal electrodes 143 are aligned as viewed in the vertical direction, by using the re-wiring layer 113. Hence, in the present embodiment, the pitch of the first through electrodes 151 and the pitch of the second through electrodes 152 are substantially equal to the pitch of the first internal electrodes 141. Although not shown in FIG. 16, the re-wiring layer 113 connects the second internal electrodes 142 to the third internal electrodes 143, as in the first embodiment.

All re-wiring is provided on the re-wiring layer 113 in the second embodiment. Therefore, the interposer chip 110 can be more easily fabricated than in the first embodiment.

Figure 17:
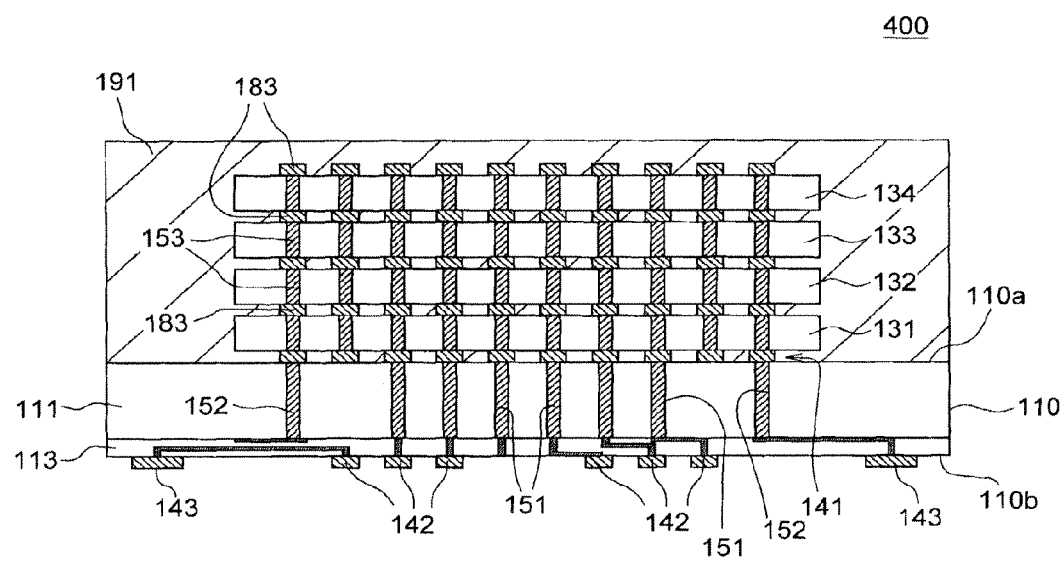
FIG. 17 is a sectional view of a semiconductor memory device 400 according to a third embodiment of the present invention.
Figure 18:
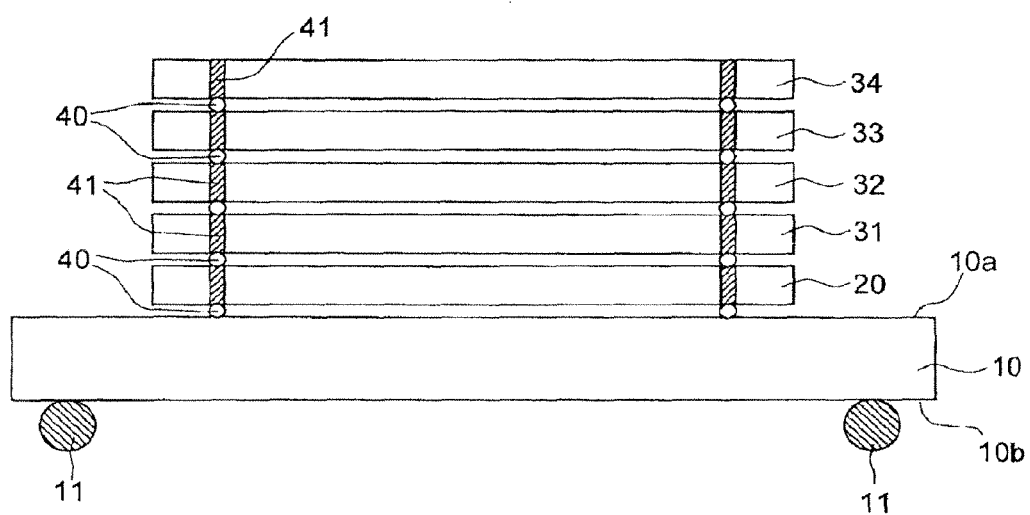
FIG. 18 is a schematic sectional view showing the structure of a conventional semiconductor memory device.

FIG. 17 is a sectional view showing a semiconductor memory device 400 that is a third embodiment of the present invention.

The semiconductor memory device 400 according to the third embodiment differs in one respect from the semiconductor memory device 300 according to the second embodiment. That is, the first through electrodes 151 and the second internal electrodes 142 are not connected in the same plane. Rather, the second internal electrodes 142 are guided by the re-wiring layer 113 and are thereby adjusted in position. In the third embodiment, the first internal electrodes 141 and the second internal electrodes 142 do not need to be aligned as viewed in the vertical direction. Thus, the interface chip 120 connected to the second internal electrodes 142 can be a general-purpose ASIC or the like, not a special ASIC that has electrodes arranged in specific positions. Furthermore, the re-wiring layer 113 can serve not only to adjust the second internal electrodes 142 in position, but also to change the pitch of the electrodes.

In the third embodiment, various types of the interface chips 120 can be utilized. Therefore, the semiconductor memory device can be manufactured at low cost.

While preferred embodiments of the present invention have been described hereinbefore, the present invention is not limited to the aforementioned embodiments and various modifications can be made without departing from the spirit of the present invention. It goes without saying that such modifications are included in the scope of the present invention.

For example, while the number of core chips are four in the above embodiments, the number is not limited thereto.

In the present invention, the interface chip can be mounted on the second surface of the interposer chip whenever desired. Hence, core chips in the form of bare chips do not need to be stocked in great quantities. Therefore, the products can be flexibly manufactured on demand to meet the customers' needs, while being prevented from being degraded in reliability. Also, since unnecessarily large quantity of stock can be avoided, the production cost of the semiconductor memory devices can be reduced.

What is claimed is:

1. A method of manufacturing a semiconductor memory device comprising:
   providing the semiconductor memory device, including:
      an interposer chip that has a plurality of first internal electrodes formed on a first surface, a plurality of second internal electrodes formed on a second surface opposite to the first surface, a plurality of third internal electrodes formed on the second surface;
   a protective sheet covering the second surface of the interposer chip; and
   a plurality of core chips that are mounted on the first surface of the interposer chip and are connected to the first internal electrodes, wherein
   the interposer chip includes a semiconductor substrate, a re-wiring layer formed on at least one of surface of the semiconductor substrate, a plurality of first through electrodes formed in the semiconductor substrate and connecting a part of the first internal electrodes to a part of the second internal electrodes, and a plurality of second through electrodes formed in the semiconductor substrate and connecting a remaining part of the first internal electrodes to a part of the third internal electrodes, and
   a pitch of the first through electrodes is substantially equal at least to a pitch of the first internal electrodes or to a pitch of the second internal electrodes, and
   peeling off the protective sheet from the interposer chip and mounting an interface chip on the second surface of the interposer chip, so that the interface chip is connected to the second internal electrodes.

2. The method as claimed in claim 1, wherein the third internal electrodes are arranged in a pitch, which is larger than the pitch of the second internal electrodes.

3. A method comprising:
   providing an intermediate product that includes:
   a wiring chip that comprises a substrate having first and second surfaces opposite to each other, a plurality of first internal electrodes formed on a side of the first surface, a plurality of second internal electrodes formed on a side of the second surface, a plurality of third internal electrodes formed on a side of the second surface, a plurality of first through electrodes each penetrating the substrate to connect an associated one of the first internal electrodes to an associated one of the second internal electrodes, and a plurality of second through electrodes each penetrating the substrate to connect an associated one of the first internal electrodes to an associated one of the third internal electrodes;
   a protective sheet covering the second surface of the wiring chip; and
   a plurality of first semiconductor chips stacked with one another over the first surface of the substrate with electrical connections to the first internal electrodes; and
   peeling off the protective sheet from the wiring chip and mounting a second semiconductor chip on the intermediate product such that the second semiconductor chip is mounted over the second surface of the substrate with electrical connections to the second internal electrodes.

4. The method as claimed in claim 3, further comprising forming external terminals respectively on the third internal electrodes.

5. The method as claimed in claim 3, further comprising molding the first semiconductor chips and at least part of the wiring chip with an encapsulating resin layer.

6. The method as claimed in claim 5, wherein the molding is carried out before mounting the second semiconductor chip.

7. The method as claimed in claim 3, wherein the substrate of the wiring chip comprises semiconductor and each of the first semiconductor chips includes memory cells to store data.

8. The method as claimed in claim 3, wherein the second semiconductor chip comprises peripheral circuits to control the first semiconductor chips for storing data.

9. The method as claimed in claim 3, wherein the wiring chip further comprises a plurality of first re-wiring layers disposed on a side of the first surface of the wiring chip, each of the first re-wiring layers connecting an associated one of the first internal electrodes to an associated one of the second through electrodes.

10. The method as claimed in claim 3, wherein the wiring chip further comprises a plurality of second re-wiring layers disposed on a side of the second surface of the wiring chip, each of the second re-wiring layers connecting an associated one of the second internal electrodes to an associated one of the first through electrodes.

11. The method as claimed in claim 10, wherein the second internal electrodes being connected to the second re-wiring layers are not aligned with positions of the first through electrodes in plan view from the side of the second surface of the wiring chip.

12. The method as claimed in claim 3, wherein the wiring chip further comprises a plurality of third re-wiring layers disposed on a side of the second surface of the wiring chip, each of the third re-wiring layers connecting an associated one of the third internal electrodes to an associated one of the second through electrodes.

13. The method as claimed in claim 3, wherein a plurality of the third internal electrodes are arranged in a pitch, which is larger than a pitch of the second internal electrodes.

14. The method as claimed in claim 3, wherein a pitch of the first through electrodes is substantially equal at least to a pitch of the first internal electrodes or to a pitch of the second internal electrodes.

15. A method comprising:
   providing an intermediate product that includes:
   a wiring chip that comprises a substrate having first and second surfaces opposite to each other, a plurality of first internal electrodes formed on a side of the first surface, a plurality of second internal electrodes formed on a side of the second surface, a plurality of third internal electrodes formed on a side of the second surface, a plurality of first through electrodes each penetrating the substrate to connect an associated one of the first internal electrodes to an associated one of the second internal electrodes, and a plurality of second through electrodes each penetrating the substrate to connect an associated one of the first internal electrodes to an associated one of the third internal electrodes;
   a protective sheet covering the second surface of the wiring chip; and
   a plurality of first semiconductor chips stacked with one another over the first surface of the substrate with electrical connections to the first internal electrodes, a size of the wiring chip being larger than the plurality of first semiconductor chips; and
   peeling off the protective sheet from the wiring chip and mounting a second semiconductor chip on the intermediate product such that the second semiconductor chip is mounted over the second surface of the substrate with electrical connections to the second internal electrodes.

16. The method as claimed in claim 15, further comprising forming external terminals respectively on the third internal electrodes.

17. The method as claimed in claim 15, further comprising molding the first semiconductor chips and at least part of the wiring chip with an encapsulating resin layer.

18. The method as claimed in claim 17, wherein the molding is carried out before mounting the second semiconductor chip.

19. The method as claimed in claim 15, wherein the substrate of the wiring chip comprises semiconductor and each of the first semiconductor chips includes memory cells to store data, and wherein the second semiconductor chip comprises peripheral circuits to control the first semiconductor chips for storing data.

20. The method as claimed in claim 15, wherein a plurality of the third internal electrodes are arranged in a pitch, which is larger than a pitch of the second internal electrodes.

* * * * *